United States Patent
Tam

(10) Patent No.: US 8,131,315 B2
(45) Date of Patent: Mar. 6, 2012

(54) WIRELESS ELECTRONIC DEVICE WITH MULTIMODE AUDIO AMPLIFIER

(75) Inventor: Ching yu John Tam, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 596 days.

(21) Appl. No.: 12/323,271

(22) Filed: Nov. 25, 2008

(65) Prior Publication Data

US 2010/0130249 A1 May 27, 2010

(51) Int. Cl.
*H04M 1/00* (2006.01)
*H04B 17/00* (2006.01)

(52) U.S. Cl. ............... 455/553.1; 455/63.1; 455/67.13; 455/550.1

(58) Field of Classification Search .................. None
See application file for complete search history.

(56) References Cited

U.S. PATENT DOCUMENTS

2008/0063219 A1* 3/2008 Park .......................... 381/107

OTHER PUBLICATIONS

"1W Dual-Mode Class AB/D Speaker Driver", Wolfson Microelectronics, WM9001 Data Sheet, [online], [retrieved on Nov. 25, 2008], <URL: http://www.wolfsonmicro.com/uploads/documents/en/WM9001.pdf>.

* cited by examiner

*Primary Examiner* — Erika Gary
(74) *Attorney, Agent, or Firm* — Treyz Law Group; G. Victor Treyz; David C. Kellogg

(57) ABSTRACT

An electronic device such as a handheld electronic device may include wireless communications circuitry. The wireless communications circuitry may include a radio-frequency receiver circuit or other circuitry that is sensitive to noise. Audio amplifier circuitry may be provided in the electronic device to amplify audio signals for a speaker. The audio amplifier circuitry may include class AB amplifier circuitry for operating in a low noise mode and class D amplifier circuitry for operating in a low power mode. The audio amplifier circuitry may include a control input path that receives control signals in real time. When it is determined that the wireless receiver or other sensitive circuit is active, the audio amplifier can be configured to operate in its low noise mode using the class AB amplifier. When it is determine that the wireless receiver is not being used, the class D circuitry may be switched into use to conserve power.

21 Claims, 6 Drawing Sheets

WIRELESS ELECTRONIC DEVICE WITH MULTIMODE AUDIO AMPLIFIER

BACKGROUND

This invention relates generally to electronic devices, and more particularly, to multimode audio amplifier circuitry for wireless electronic devices.

Electronic devices such as handheld electronic devices and other portable electronic devices are becoming increasingly popular. Examples of handheld devices include handheld computers, cellular telephones, media players, and hybrid devices that include the functionality of multiple devices of this type. Popular portable electronic devices that are somewhat larger than traditional handheld electronic devices include laptop computers and tablet computers.

Due in part to their mobile nature, portable electronic devices are often provided with wireless communications capabilities. For example, handheld electronic devices may use long-range wireless communications to communicate with wireless base stations. Cellular telephones and other devices with cellular capabilities may communicate using cellular telephone bands at 850 MHz, 900 MHz, 1800 MHz, 1900 MHz, and 2100 MHz. Portable electronic devices may also use short-range wireless communications links. For example, portable electronic devices may communicate using the Wi-Fi® (IEEE 802.11) bands at 2.4 GHz and 5.0 GHz and the Bluetooth® band at 2.4 GHz. Global positioning system signals at 1575 MHz may also be received by cellular telephones.

Portable electronic devices may also include audio amplifier circuitry for playing audio to a user. The audio amplifier circuitry may, for example, be used to play media files such as song files to a user through a headset.

Challenges arise when providing handheld devices with wireless capabilities and high quality audio amplifier circuitry. Some audio amplifiers exhibit good power consumption performance, but tend to be electrically noisy. Particularly when a user is performing a sensitive wireless operation such as when the user is receiving radio-frequency signals, the noise produced by the audio amplifier circuitry can interfere with proper operation of the device. Although less noisy audio amplifier circuitry could be used, low noise audio amplifier circuits tend to consume larger amounts of power, reducing battery life.

It would therefore be advantageous to be able to provide electronic devices that produce high quality audio signals without interfering with wireless operations or consuming excessive amounts of power.

SUMMARY

An electronic device such as a handheld electronic device or other portable electronic device may include wireless communications circuitry or other circuitry that includes a sensitive circuit. The sensitive circuit may be, for example, a radio-frequency receiver that is used in receiving wireless cellular telephone signals. When in operation, the sensitive circuitry may be sensitive to noise. For example, a radio-frequency receiver may be sensitive to noise that is coupled back to its input.

The electronic device may have an audio amplifier. The audio amplifier may be used to amplify audio signals when it is desired to play audio through a speaker or headset. The audio amplifier may be operated in multiple modes. For example, the audio amplifier may be operated in a low noise mode and a low power mode. The mode of operation of the audio amplifier may be adjusted in real time based on whether or not there is a present need to operate the sensitive circuit.

If, for example, the radio-frequency receiver is being used to receive signals, the audio amplifier may be placed in its low noise mode of operation to avoid creating noise that might interfere with operation of the radio-frequency receiver. If the radio-frequency receiver is not being used, the audio amplifier may be placed in its low power mode of operation to conserve power and thereby extend battery life for the handheld electronic device.

The audio amplifier may have class D circuitry for operating in low power mode and may have class AB circuitry for operating in low noise mode. Other classes of amplifier circuitry may also be used if desired. A voltage ramp generator in the class D amplifier circuitry of the adjustable audio amplifier may be operated at a frequency that maximizes immunity to interference from the wireless communications circuitry. For example, if the wireless communications circuitry includes Global System for Mobile (GSM) communications circuitry with a 217 Hz time-division multiple access (TDMA) clock, the ramp generator may be operated at a frequency that is an integral multiple of 217 Hz, so that any mixing of noise from the 217 Hz TDMA clock will fall out of the audio band.

Further features of the invention, its nature and various advantages will be more apparent from the accompanying drawings and the following detailed description of the preferred embodiments.

DETAILED DESCRIPTION

Figure 1:
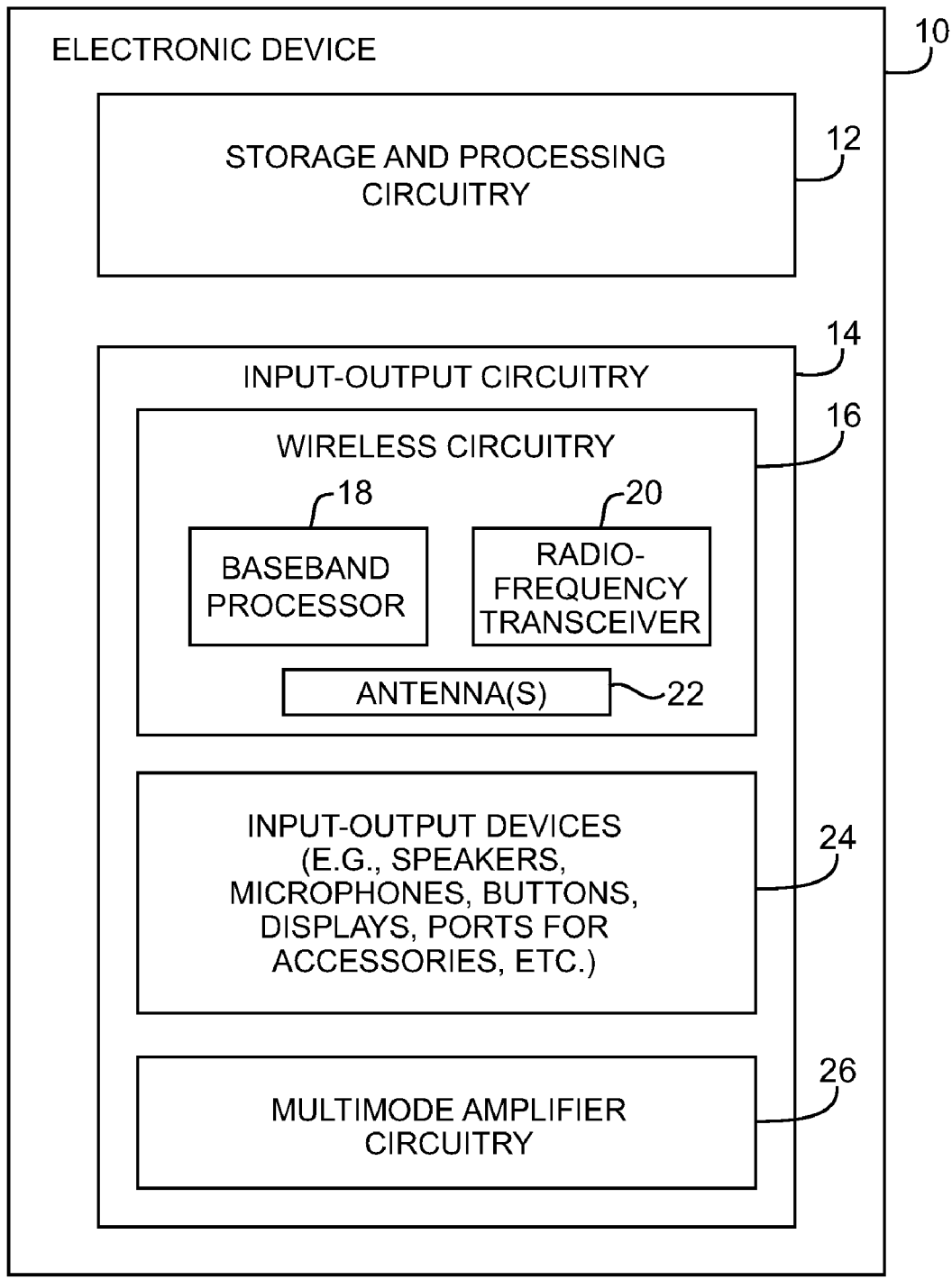
FIG. 1 is a diagram of illustrative circuitry that may be used in an electronic device in accordance with an embodiment of the present invention.

The present invention relates generally to electronic devices, and more particularly, to audio amplifier circuitry for electronic devices such as wireless electronic devices. The audio circuitry may be adjusted in real time to operate in one of multiple modes.

The audio circuitry in a given electronic device may, for example, be adjusted to operate in either a first mode such as a high power mode characterized by relatively low noise levels or in a second mode such as a low power mode characterized by higher noise levels. Wireless circuitry in the electronic device may be used to transmit and receive wireless signals. The wireless circuitry may, for example, transmit and receive Global System for Mobile (GSM) communications signals, code division multiple access (CDMA) communications signals, or wideband code division multiple access (WCDMA) communications signals.

When the wireless circuitry is being used to perform a sensitive operation such as when the wireless circuitry is being used to receive radio-frequency signals, the audio circuitry may be placed in its low noise state. This helps avoid interference between the audio circuitry and the wireless circuitry. When the wireless circuitry is not being used to perform a sensitive operation such as when no incoming signals are being received, the audio circuitry may be placed in its higher noise and lower power state to conserve power.

If desired, the multimode amplifier circuitry may be operated in additional modes, such as modes of operation that consume intermediate amounts of power and produce intermediate amounts of noise. For clarity, the present invention is sometimes described herein in the context of multimode amplifier circuits that operate in first and second modes (i.e., dual mode audio amplifier circuitry). This is, however, merely illustrative. The audio amplifier circuitry in the electronic devices may support any desired number of operating modes.

Moreover, the audio amplifier circuitry may be used in any suitable electronic device. The use of dual mode audio amplifier circuitry in the context of wireless communications devices that have more sensitive and less sensitive modes of operation is merely illustrative.

The wireless electronic devices that contain the dual mode amplifier circuitry may be portable electronic devices such as laptop computers or small portable computers of the type that are sometimes referred to as ultraportables. Wireless electronic devices with dual mode amplifier circuitry may also be somewhat smaller portable electronic devices. Examples of smaller portable electronic devices include wrist-watch devices, pendant devices, headphone and earpiece devices, and other wearable and miniature devices. With one suitable arrangement, the portable electronic devices may be handheld electronic devices.

The electronic devices may be, for example, handheld wireless devices such as cellular telephones, media players with wireless communications capabilities, handheld computers (also sometimes called personal digital assistants), remote controllers, global positioning system (GPS) devices, and handheld gaming devices. The electronic devices may also be hybrid devices that combine the functionality of multiple conventional devices. Examples of hybrid portable electronic devices include a cellular telephone that includes media player functionality, a gaming device that includes a wireless communications capability, a cellular telephone that includes game and email functions, and a portable device that receives email, supports mobile telephone calls, has music player functionality and supports web browsing. With one suitable arrangement, dual mode audio amplifier circuitry may be incorporated into a cellular telephone such as the iPhone® cellular telephone available from Apple Inc. of Cupertino, Calif. These are merely illustrative examples.

An illustrative electronic device in accordance with an embodiment of the present invention is shown in FIG. 1. Device 10 of FIG. 1 may be, for example, a wireless handheld electronic device that supports 2G and/or 3G cellular telephone and data functions, global positioning system capabilities, and local wireless communications capabilities (e.g., IEEE 802.11 and Bluetooth®) and that supports handheld computing device functions such as internet browsing, email and calendar functions, games, music player functionality, etc.

Device 10 may have storage and processing circuitry 12 that is used in controlling the operation of device 10. Circuitry 12 may include one or more different types of storage such as hard disk drive storage, nonvolatile memory (e.g., flash memory or other electrically-programmable-read-only memory), volatile memory (e.g., static or dynamic random-access-memory), etc. Processing circuitry in circuitry 12 may be based on one or more processors such as microprocessors and other suitable integrated circuits.

Storage and processing circuitry 12 may be used to run software on device 10 such as applications and operating system components. The software may be used in implementing communications protocols such as wireless local area network protocols (e.g., IEEE 802.11 protocols—sometimes referred to as Wi-Fi®), protocols for other short-range wireless communications links such as the Bluetooth® protocol, protocols for handling 3G communications services (e.g., using wide band code division multiple access techniques), 2G cellular telephone communications protocols, etc. The software may also be used for controlling the operation of other circuitry such as audio amplifier circuitry (e.g., to switch operating modes).

Device 10 may have input-output circuitry 14. Input-output circuitry 14 may be used to allow data to be supplied to device 10 and may be used to allow data to be provided from device 10 to external devices. Input-output circuitry 14 may include input-output devices 24. Input-output devices 24 may include one or more displays. For example, input-output circuitry 14 may include a display such as a liquid crystal display (LCD), an organic light-emitting diode (OLED) display, a plasma display, an electronic ink display, or other suitable components that present visual information to a user. If desired, touch screen functionality may be integrated into a display. Input-output devices 24 may also include input control devices such as buttons and other switches and input-output ports such as data ports and ports for microphones and speakers. Input-output jacks in input-output devices 24 may be used for audio and video. For example, an audio jack may be used to attach an accessory such as a stereo headset to device 10. Input-output devices 24 may also include controls such as touch pads, pointing sticks, joysticks, click wheels, scrolling wheels, key pads, keyboards, cameras, or other suitable interfaces for controlling device 10.

Wireless communications circuitry 16 may include one or more antennas 22 and communications circuitry such as radio-frequency (RF) transceiver circuitry 20 and baseband processor 18. Baseband processor 18 may receive data from storage and processing circuitry 12 and may use radio-frequency transceiver circuitry to transmit the data through antennas 22. Receiver circuitry in radio-frequency transceiver 20 may be used in receiving radio-frequency signals from antenna 22. The signals that are received may be processed using circuits such as baseband processor 18 and storage and processing circuitry 12. Circuitry 16 may include power amplifier circuitry, passive RF components, switches, and other circuitry for handling RF wireless signals.

Any suitable antenna structures may be used in device 10. For example, device 10 may have one antenna or may have multiple antennas. If multiple antennas are used, each antenna may be used to cover a single communications band or each antenna may cover multiple communications bands. If desired, one or more antennas may cover a single band while one or more additional antennas are each used to cover multiple bands. Communications bands that may be covered in device 10 include the Global System for Mobile (GSM) communications bands at 850 MHz, 900 MHz, 1800 MHz, and 1900 MHz. Communications bands such as the data communications band at 2100 MHz may also be covered. If desired, device 10 may be used to handle the Wi-Fi® (IEEE 802.11) bands at 2.4 GHz and 5.0 GHz (also sometimes referred to as wireless local area network or WLAN bands), the Bluetooth® band at 2.4 GHz, and the global positioning system (GPS) band at 1575 MHz. These are merely illustrative examples. Wireless communications circuitry 16 of device 10 may, in general, be used to handle radio-frequency signals at any suitable communications frequencies.

Electronic device 10 may be used to play audio for a user. The audio may, for example, be audio that is associated with a cellular telephone voice call. Audio may also be associated with media playback operations or games. For example, a media player may be implemented using storage and processing circuitry 12. The media player may play digital music and videos that contain audio tracks to the user. Video and audio may also be presented to the user through a web browser or other application that accesses online media content.

Audio amplifier circuitry 26 may amplify audio signals that are being played for a user. Audio may be presented to a user through headphones or other external speakers. These speakers may be connected to amplifier 26 in device 10 using an audio jack or using a data port. Audio may also be played to a user through one or more speakers mounted within the housing of device 10 using amplifier 26.

In many electronic devices, different circuit functions have conflicting needs. For example, in many wireless electronic devices, it is desirable to use low-noise audio amplifiers, because low-noise audio amplifiers minimize potential interference with wireless communications circuitry such as radio-frequency receiver circuitry. One commonly-used low-noise amplifier is the so-called class AB amplifier. Audio amplifiers based on a class AB design tend to exhibit low amounts of noise, which makes them suitable for use in electronic devices with sensitive wireless circuitry. However, class AB audio amplifiers tend to consume more power than noisier types of amplifiers such as class D audio amplifiers. The use of class AB audio amplifiers may therefore reduce battery life. A designer who is concerned about the amount of power that is consumed by class AB amplifier circuitry might incorporate a class D audio amplifier into a wireless device in place of a class AB audio amplifier. This approach may reduce power consumption, but can expose the wireless circuitry in the wireless device to noise interference from the class D amplifier.

In accordance with embodiments of the present invention, these conflicting demands are addressed by incorporating adjustable amplifier circuitry into device 10 such as multimode amplifier circuitry 26 of FIG. 1. The operating mode of the adjustable amplifier circuitry may be adjusted in real time as appropriate. At any given time, the amplifier mode may be selected based on time-varying noise limits imposed by sensitive circuitry in the device. For example, during active wireless operations or other operations in which low noise is of concern, the adjustable amplifier may be placed in a low noise mode. When wireless operations are complete, the adjustable amplifier may be placed into a low power high noise mode. Because most or all of the wireless circuitry is inactive in this mode, the noise produced by the adjustable amplifier will not interfere with proper operation of the device.

Although described in the context of an electronic device having sensitive wireless communications circuitry, in general, any suitable electronic device may benefit from incorporation of a multimode audio amplifier with real-time mode control. For example, an electronic device may have sensitive circuitry that is related to audio capture operations, sensitive circuitry that is used to capture video or still images, sensitive circuitry that is used to make sensor measurements, or other sensitive circuitry. During operation of the electronic device, control circuitry in the device can determine whether there is a need to operate the sensitive circuitry. When this need is detected, the audio amplifier may be switched into a mode of operation in which a reduced amount of noise is produced by the audio amplifier. When the sensitive circuitry is inactive, the risk of noise interference is reduced or eliminated, so the audio amplifier may be switched into a more efficient mode of operation. In the more efficient mode of operation, power consumption is reduced. Some elevated levels of noise may be produced when operating the audio amplifier in its more efficient mode of operation, but this noise can be tolerated by the active circuitry in the electronic device, because the sensitive circuitry is not being used.

Figure 2:
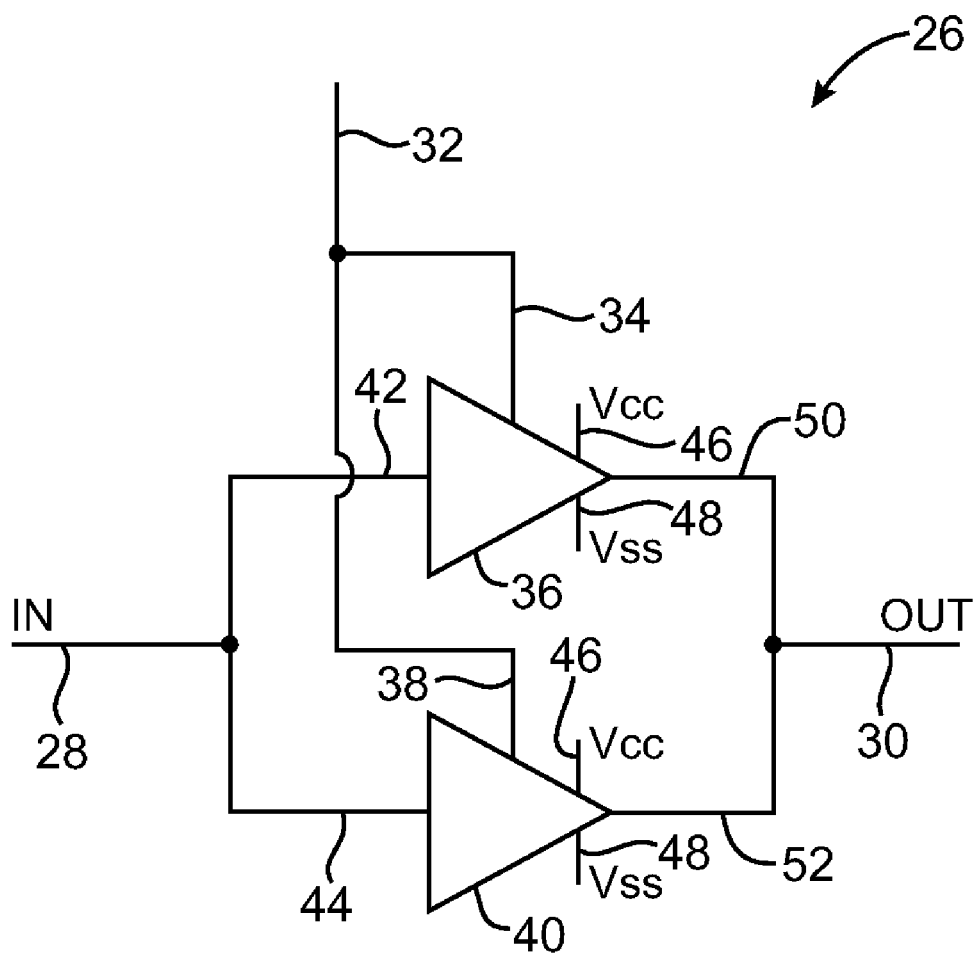
FIG. 2 is a diagram of an illustrative multimode audio amplifier that may be used in an electronic device in accordance with an embodiment of the present invention.

A circuit diagram of illustrative adjustable amplifier circuitry is shown in FIG. 2. As shown in FIG. 2, amplifier 26 may have an input 28 that receives audio input signals IN that are to be amplified. Corresponding amplified audio signals OUT may be provided at output 30. A control path such as control path 32 may be used to convey control signals to amplifier 26 in real time. Control path 32 may include one or more signal lines and may be used to convey analog or digital control signals. The control signals may be provided by circuitry that is part of wireless communications circuitry 16 or other input-output circuitry 14, circuitry in storage and processing circuitry 12, or other circuitry in device 10.

Amplifier 26 may have multiple amplifier circuits such as amplifier circuit 36 and amplifier circuit 40. Each of these amplifier circuits may have different performance characteristics. For example, each amplifier circuit in amplifier 26 may have a different power consumption characteristic. Each amplifier circuit in amplifier 26 may also have a different noise characteristic. In general, there is a tradeoff between noise generation and power consumption, so a typical arrangement for amplifier 26 will include a first amplifier circuit such as amplifier circuit 36 that has a relatively higher power consumption level and a relatively lower noise level and a second amplifier circuit such as circuit 40 that has a relatively lower power consumption level and a relatively higher noise level. If desired, some of the circuitry that makes up circuits 36 and 40 may be shared.

Additional amplifier circuits may also be provided in amplifier 26. For example, a third amplifier circuit may be provided that produces more noise than amplifier circuit 36 and less noise than amplifier circuit 40 at intermediate levels of power consumption. Still further amplifier circuits having other levels of noise and power consumption may be included in amplifier 26 if desired. The use of a dual mode architecture in which two amplifier circuits (i.e., circuits 36 and 40) are used in amplifier 26 is shown in FIG. 2 as an example.

Input signal IN on input path 28 may be routed to the input of amplifier circuit 36 using input path 42. The same input signal IN may be routed to the input of amplifier circuit 40 via path 44. Amplifier circuits 36 and 40 may be powered by positive power supply voltage Vcc on positive power supply terminals 46 and a ground voltage Vss on ground terminals 48. The output signal from amplifier 36 may be routed to output line 30 via output path 50. Output path 52 may be used to route output signals from amplifier circuit 40 to output path 30. If desired, amplifier circuits 36 and 40 may share an output stage and other circuitry.

Depending on the desired mode of operation, either amplifier circuit 36 or amplifier 40 may be used as the main operating portion of amplifier 26. When it is desired to minimize noise to ensure proper operation of sensitive circuitry in device 10, for example, amplifier circuit 36 may be switched into use. Amplifier circuit 36 may amplify signals IN to produce output signals OUT without introducing excessive noise into device 10. When, on the other hand, it is determined that device 10 can tolerate higher levels of noise, amplifier 40 may be switched into use to reduce power consumption.

Audio amplifiers are sometimes categorized by their class. Examples of audio amplifier classes include A, AB, B, C, D, E, and F, in order of decreasing power consumption and increasing noise. Moreover, amplifiers in a given class may be constructed with different levels of power consumption and noise. For example, a first class D amplifier can be configured to exhibit higher noise and lower power consumption when compared to a second class D amplifier. Amplifier circuits 36 and 40 and other amplifier circuits in amplifier 26 may be formed using any suitable amplifier architecture. For example, amplifier circuit 36 may be a class A amplifier, whereas amplifier 40 may use a design of one of the more energy-efficient amplifier classes (e.g., class AB, class B, class C, class D, etc.). As another example, amplifier circuit 36 may be a class AB amplifier, whereas amplifier 40 may be an amplifier of class B, class C, class D, etc.). Other arrangements may also be used in which amplifier circuit 36 uses an amplifier of a lower noise class than amplifier 40.

If desired, both amplifier circuit 36 and amplifier circuit 40 may be class D amplifiers or other amplifiers of the same class. In this type of scenario, amplifier circuit 36 may be configured to produce less noise while consuming more power than amplifier circuit 40. This relationship between the noise production and power consumption of amplifier circuits 36 and 40 may be created by selection of the transistor sizes, component values, control signal frequencies, and power supply voltages for each amplifier circuit (as examples).

With one suitable arrangement, which is sometimes described herein as an example, amplifier circuit 36 may be a class AB amplifier and amplifier circuit 40 may be a class D amplifier. The control signals on path 32 may be adjusted in real time during operation of device 10 to ensure that amplifier 26 operates in an appropriate mode. When minimum noise is required to satisfy the operating demands of a sensitive circuit such as a radio-frequency receiver, amplifier 26 can use the amplifying capabilities of lower-noise amplifier circuit 36. When minimum noise is not required, amplifier 26 can be adjusted so that amplifier 26 uses the amplifying capabilities of amplifier circuit 40.

Figure 3:
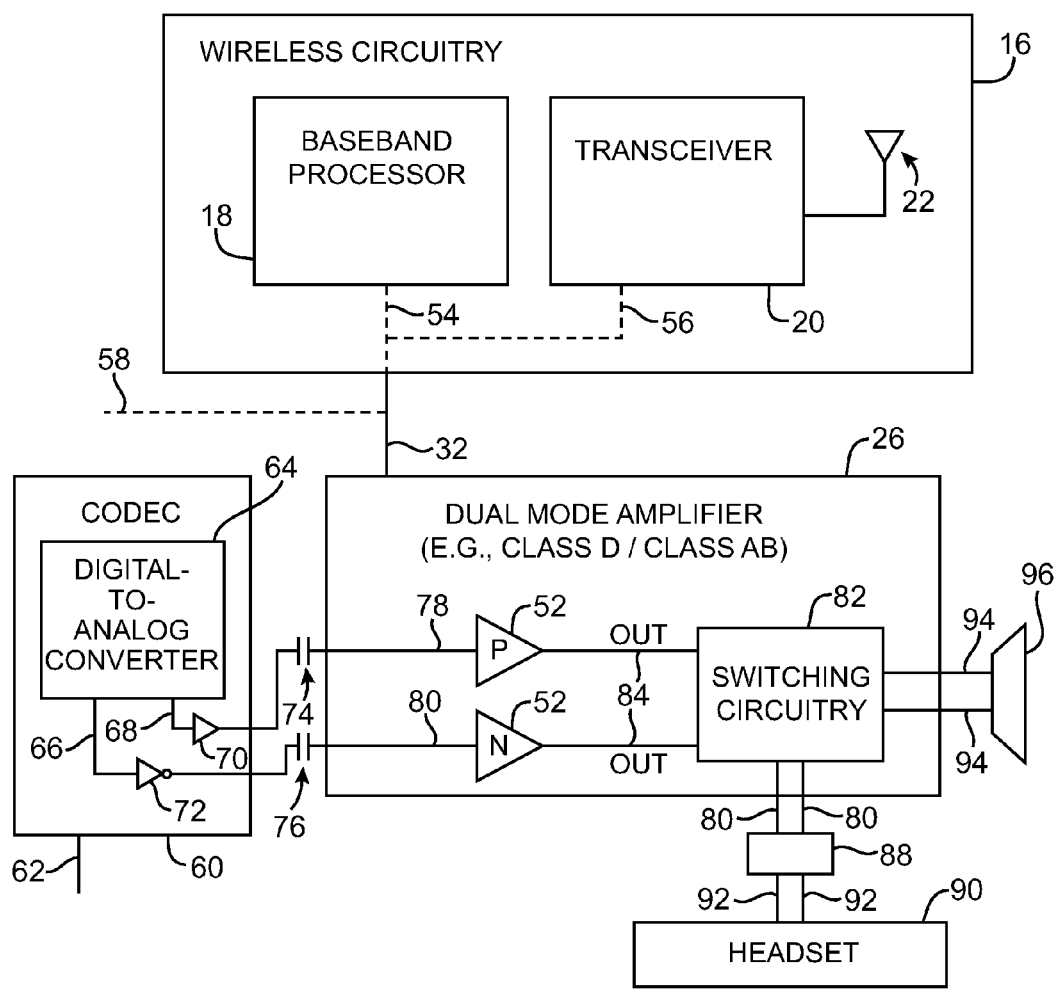
FIG. 3 is a diagram of circuitry such as wireless communications circuitry and dual mode amplifier circuitry in an electronic device in accordance with an embodiment of the present invention.

The control signals that are supplied to amplifier 26 on path 32 may be generated by any suitable circuitry in device 10. As shown in FIG. 3, path 32 may be supplied with control signals in real time by wireless circuitry 16. For example, baseband processor 18 may supply control signals to path 32 using path 54. The baseband process may, as an example, generate a logic high signal when a radio-frequency receiver in wireless circuitry 16 (e.g., a radio-frequency receiver in transceiver 20) is active and baseband processor is being used to receive radio-frequency signals from antenna 22. The baseband processor may generate a logic low signal when the radio-frequency receiver is inactive. By asserting and deasserting the control signal on line 32 in this way, amplifier 26 can be placed in an appropriate operating mode.

If desired, control signals for path 32 may be produced by transceiver 20 or other suitable circuitry in wireless circuitry 16, as indicated by dashed line 56. Storage and processing circuitry 12 (FIG. 1) may also be used to generate control signals. These control signals may be supplied to path 32 using path 58. Combinations of these control signal sources may also be used. For example, both storage and processing circuitry 12 and wireless circuitry 16 may assert a "low noise request" signal whenever low noise audio amplifier operation is desired. Logic circuitry that is interposed in path 32 or that is incorporated into dual mode amplifier 26 may be used to process these requests and generate corresponding internal control signals for selectively activating and deactivating amplifier circuits 36 and 40 (as an example).

As shown in FIG. 3, audio amplifier 26 may contain two amplifier blocks 52. These amplifier blocks may be driven 180° out of phase from the other. For example, the audio input signal provided on input 78 of amplifier block "P" may be identical to the audio input signal provided on input 80 of amplifier block N, but these two signals may be 180° out-of-phase. In this type of arrangement, amplifier 26 may be referred to as using a bridge drive configuration.

The out-of-phase signals on lines 78 and 80 may be produced by upstream audio circuitry such as codec circuit 60. Circuit 64 may be implemented using a single audio integrated circuit or multiple circuits. A digital-to-analog converter circuit such as digital-to-analog converter 64 may be provided with an input signal such as a digital input signal received from storage and processing circuitry 12 on input 62. Digital-to-analog converter 64 may convert the received digital audio signal into corresponding analog audio signals on paths 66 and 68. Buffer 70 and inverting buffer 72 may drive the audio from digital-to-analog converter 64 onto respective lines 78 and 80 via coupling capacitors 74 and 76.

The amplifier circuitry of blocks 52, which is responsive to the control signals provided on path 32, may drive amplified audio signals onto lines 84. Switching circuitry 82 may be used to route the audio signals on lines 84 to a suitable output device. In the example of FIG. 3, a speaker such as speaker 96 is connected to switching circuitry 82 using lines 94 and an external accessory that contains speakers such as headset 90 is connected to switching circuitry 82 via lines 80, an audio connector such as audio jack and plug 88, and lines 92. Other speakers may be connected to outputs 84 if desired. Moreover, switching circuitry 82 may be omitted (e.g., in systems that only use a single type of speaker).

Each amplifier block 52 may include amplifier circuitry that supports multiple modes of operation (e.g., a class AB mode, a class D mode, or other suitable low-power and high-power modes). An amplifier block that supports both class AB operation and class D operation can switch between the two modes in real time based on the value of the control signals received from path 32.

Figure 4:
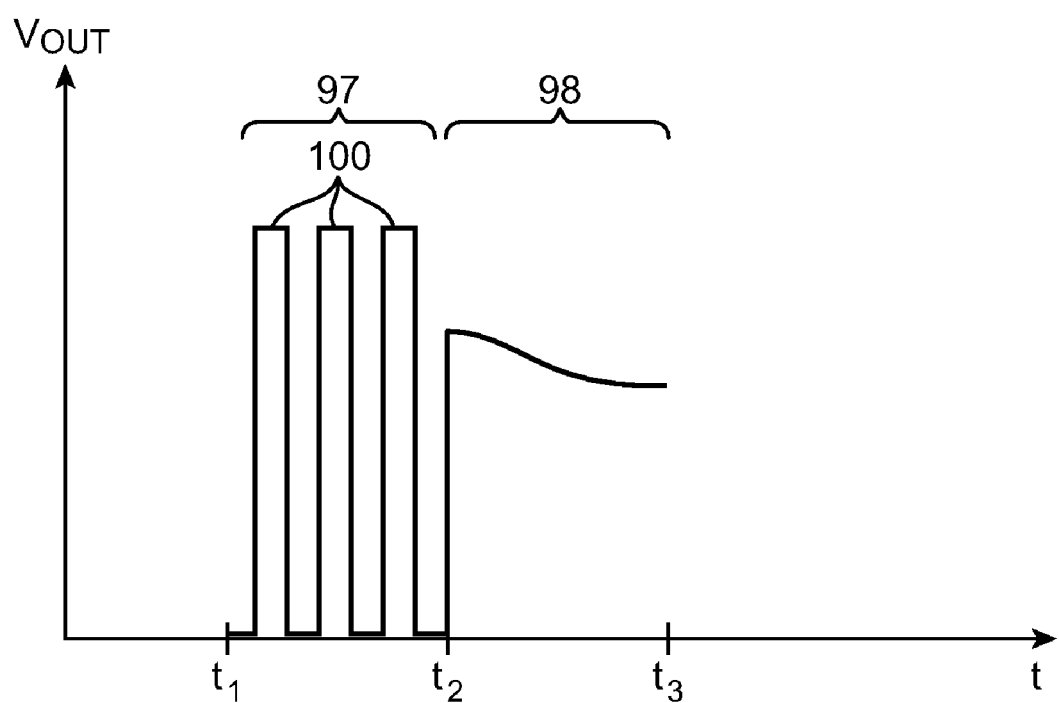
FIG. 4 is a graph of amplifier output signals that may be provided by a dual mode audio amplifier when transitioning between its two modes of operation in accordance with an embodiment of the present invention.

During operation of device 10, as device 10 transitions between a state in which a low noise requirement is imposed upon amplifier 26 and a state in which the low noise requirement is not imposed upon amplifier 26, the output signals from amplifier blocks 52 may likewise transition between class AB and class D output signals. FIG. 4 shows an illustrative output signal Vout that may be produced on one of lines 84 during operation in different amplifier modes. The illustrative output voltage signal Vout in FIG. 4 is plotted as a function of time t. Between times t1 and t2, amplifier 26 is operating in low power mode (i.e., class D amplifier mode), whereas amplifier 26 is operating in class AB mode (or other low noise mode) during times t2 to t3.

As shown in FIG. 4, at times between t1 and t2 (i.e., in region 97 of the graph of FIG. 4), the illustrative output signal contains a number of pulses 100. When applied to a speaker such as speaker 96 or a speaker in headset 90, the circuit characteristics of the speaker (e.g., its inductance and resistance), convert the pulses into an analog signal with frequency components in the audible range (e.g., within 20 Hz to 20 kHz). The width of pulses 100 is proportional to the magnitude of the audio signal being amplified. At time t2, amplifier 26 switches from providing a class D output signal to a class AB output signal. The class AB output signal is shown in region 98 of the graph of FIG. 4.

Figure 5:
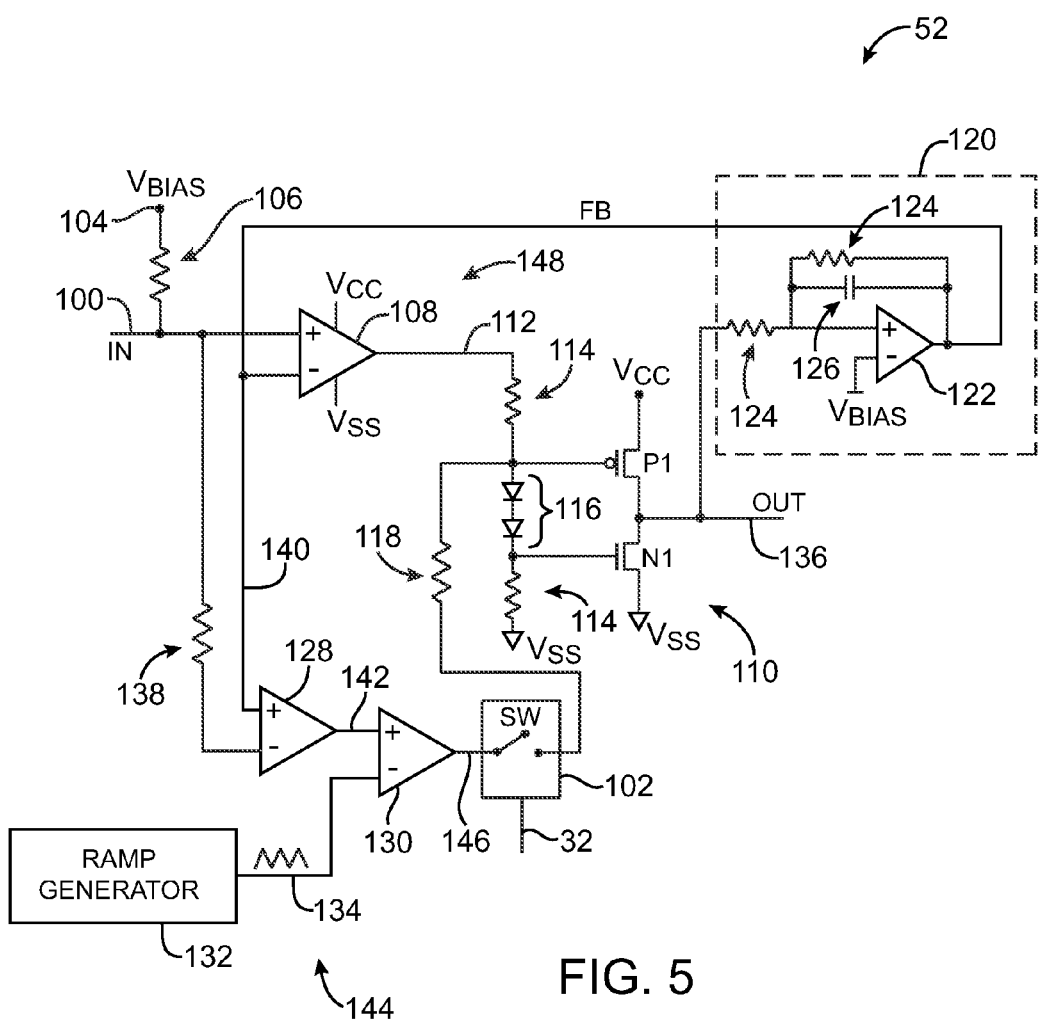
FIG. 5 is a circuit diagram of an illustrative dual mode audio amplifier circuit that may be used in an electronic device such as a handheld electronic device with wireless communications circuitry in accordance with an embodiment of the present invention.

Illustrative circuitry that may be used to implement circuit blocks such as circuit blocks 52 of FIG. 3 is shown in FIG. 5. In the example of FIG. 5, audio circuit block 52 is a dual mode audio circuit capable of switching between a class D operating mode and a class AB operating mode. The class AB portion of circuit 52 is always active. When the class D portion of circuit 52 is enabled by closing switch 102 in response to a control signal received on control signal input path 32, the class D portion of circuit 52 overdrives the class AB portion, causing circuit 52 to transition to class D mode.

Input signals for circuit 52 may be received at input 100. A direct current (DC) bias voltage Vbias may be supplied to the input signal path using terminal 104 and resistor 106. Input audio signals may be amplified by class AB driver 108, which serves as a controller for class AB circuitry 148. When amplifier block 52 is operated in class D mode, amplifier 108 serves as an error amplifier that helps enhance linearity.

The output of operational amplifier 108 may be provided to output stage 110 via operational amplifier output path 112. Resistors 114 and diodes 116 are examples of circuit elements that may be used in circuit 52 to form a biasing network for drive transistors P1 and N1. Resistors 114 may be implemented using metal-oxide-semiconductor transistors configured as load elements or may be implemented using polysilicon resistive elements (as examples). Diodes 116 may be implemented using stand-alone pn junctions or as part of a diode-connected metal-oxide-semiconductor transistor structure. If desired, other load elements such as one or more resistors may be used in place of diodes 116. Resistor 118 may serve as a series resistor through which class D pulses are received from switch 102 (i.e., pulses 100 of FIG. 4).

Class D amplifier circuitry 144 may use a comparator such as comparator 130 to compare incoming audio signals from input 100 to ramped reference voltage signals on path 134. Pulses 100 of FIG. 4 vary between ground voltage Vss (e.g., 0 volts) and a positive power supply voltage (e.g., Vcc). The signal on line 142 is an analog audio signal. So long as the magnitude of the analog audio signal on line 142 is less than magnitude of the voltage being ramped on line 132, a positive output signal representing the maximum pulse height for a pulse 100 will be produced on output 146 of comparator 130. The ramped voltage serves to sample the magnitude of the voltage on line 142. As soon as the ramped voltage on line 134 exceeds the voltage on line 142, the output of comparator 130 goes low to 0 volts (i.e., the trailing edge of the pulse 100 is produced). With this sampling scheme, larger voltages on line 142 will produce longer pulses 100 and smaller voltages on line 142 will produce shorter pulses 100. The frequency of pulses 100 is determined by the frequency of the ramped output voltage produced at the output of ramp generator 132.

Some wireless communications systems use time-division multiple access (TDMA) schemes. For example, in addition to using carrier frequency multiplexing techniques, GSM communications systems may use TDMA schemes to subdivide individual carrier frequencies into time slots. Each user may be assigned use of a particular time slot among eight slots in a TDMA frame. The clock rate for TDMA frames may be 217 Hz.

To avoid interference with GSM communications, it may be desirable to ensure that the operating frequency of ramp generator 132 is an integer multiple of 217 Hz in devices 10 in which wireless communications circuitry 16 supports GSM communications. The frequency of ramp generator 132 should also be high enough to produce pulses 100 at a frequency that is above the upper end of the audio spectrum (i.e., above 20 kHz). As an example, the frequency of the output of ramp generator 132 may be 217 kHz. With this type of arrangement, potential interference between class D amplifier circuitry 144 and 217 Hz GSM clock signals associated with wireless communications circuitry 16 will tend to mix out of the audio band.

During class D operation, switch 102 is closed and pulses 100 are applied to drive stage 110 via comparator output 146, switch 102, and resistor 118. Stage 100 may include p-channel metal-oxide-semiconductor transistor P1 and n-channel metal-oxide-semiconductor transistor N1. Transistors P1 and N1 may be connected in series between positive power supply voltage terminal Vcc and ground voltage supply terminal Vss. The output of output stage 110 on line 136 serves as amplifier output signal OUT. As shown in FIG. 3, another amplifier block 52 may simultaneously be driven 180° out of phase to drive a speaker in a bridge drive configuration.

Amplifier block 52 may have a feedback path FB between output line 136 and the inputs of class AB circuitry 148 and class D circuitry 144. A circuit such as circuit 120 may be interposed in feedback path FB to help integrate pulses 100 from class D circuitry 144. Circuit 120 may be any suitable integrating circuit. In the example of FIG. 5, circuit 120 includes operational amplifier 122, resistors 124, and capacitor 126. Capacitor 126 and the resistor 124 that is connected in parallel with capacitor 126 and operational amplifier 122 provide feedback for operational amplifier 122 and configure circuit 120 to serve as a low pass filter for feedback path FB.

Feedback signals from feedback path FB may be used as a form of negative feedback that stabilizes the operation of amplifier block 52. Negative feedback for class AB circuitry 148 may be provided by connecting feedback path FB to the negative input of operational amplifier 108. Negative feedback for class D circuitry 144 may be provided by connecting feedback path FB to the negative input of operational amplifier 128 via path 140. The negative feedback produced by introducing feedback signals into the class AB and class D amplifiers stabilizes the gain for the class D amplifier and, to a somewhat lesser extent, the class AB amplifier.

In class AB amplifier mode, the control signal on path 32 opens switch 102. In this situation, class D circuitry 144 is disconnected from output stage 110 and is therefore disabled, whereas the signals from class AB amplifier circuitry 148 are routed to output stage 110 and are applied to the speaker.

In class D amplifier mode, the control signal on path 32 closes switch 102. In this situation, class D circuitry 144 is connected to output stage 110. The circuitry of class AB amplifier 148 in block 52 is always active (so there is always an available drive signal for output stage 110, minimizing glitches when transitioning between modes), but when class D amplifier circuitry 144 is connected to output stage 110, the class D signals (pulses 100 of FIG. 4) overdrive the analog class AB amplifier signals from amplifier circuitry 148. The closure of switch 102 therefore serves to disable the class AB functionality of amplifier block 52 while enabling the class D functionality of amplifier block 52.

If desired, the transition between amplifier classes may have an associated minimum lockout time. This may help ensure that output glitches will be less noticeable to the user in the event that matching between the class AB and class D stages is not perfect.

Figure 6:
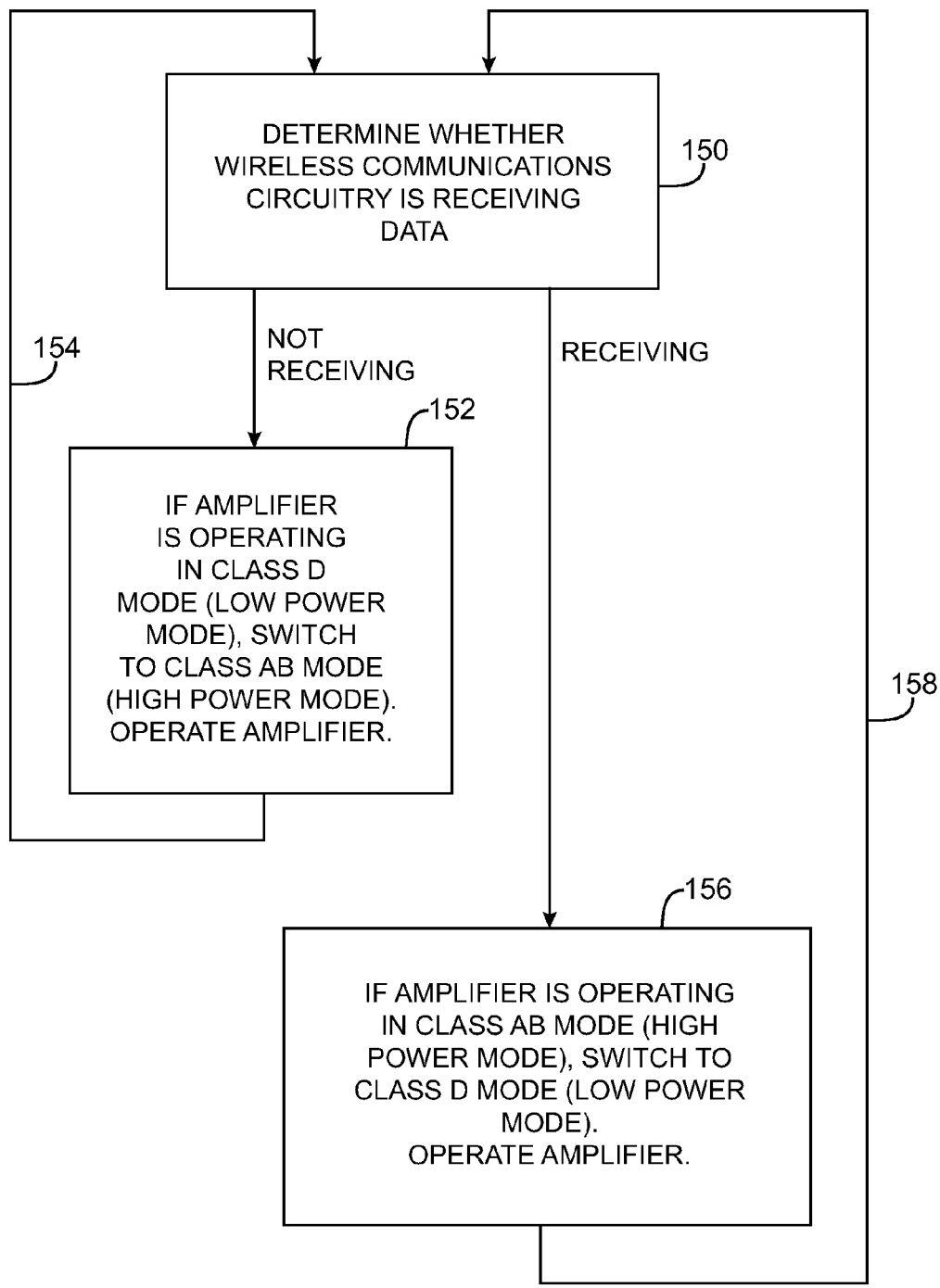
FIG. 6 is a flow chart of illustrative steps involved in operating an electronic device with wireless circuitry and a multimode audio amplifier in accordance with an embodiment of the present invention.

FIG. 6 is a flow chart of illustrative steps involved in using an electronic device that has sensitive circuitry and an adjustable audio amplifier. In the example of FIG. 6, the sensitive circuitry is made up of wireless communications circuitry such as a radio-frequency receiver. The operation of the radio-frequency receiver may be adversely affected when noise is produced by an audio amplifier operated in a relatively noisy mode (e.g., as a class D amplifier). Accordingly, the amplifier may be adjusted in real time to operate in a low noise mode whenever the radio-frequency receiver is operated. In general, the real-time operating mode adjustments that are made to the audio amplifier circuitry may be based on the desired use of any suitable sensitive circuitry. The detection of wireless circuitry operating modes and subsequent control of amplifier operating modes is described in connection with FIG. 6 as an example.

As shown in FIG. 6, the presence or absence of a present need to operate wireless communications circuitry 16 or other suitable sensitive circuitry in device 10 can be detected at step 150. During step 150, control circuitry in device 10 can be used to monitor system status. For example, circuitry in baseband processor 18 or other wireless circuitry 16 or storage and processing circuitry 12 may determine whether wireless communications circuitry 16 is being used to perform a function that is sensitive to the presence of noise (i.e., whether circuitry 16 is in use or is needed for sensitive wireless functions by an application that has been launched or that is about to be launched). The sensitive function might be, for example, a function related to receiving wireless data using antenna 22 and radio-frequency transceiver 20. If it is determined that wireless circuitry 16 or other sensitive circuitry is not receiving radio-frequency data or otherwise does not need to be used, processing may proceed to step 152.

During step 152, device 10 may adjust the state of the control signals on control path 32 of audio amplifier 26. If, for example, amplifier 26 is operating in a relatively less noisy, but power inefficient mode such as class AB mode, the control signal on path 32 may be changed (e.g., from a logic high to a logic low or vice versa depending on the signaling convention being used) to place amplifier 26 in an energy-efficient mode such as class D mode. In response to the control signal on path 32, circuitry in audio amplifier 26 such as switch 102 of FIG. 5 may be adjusted. For example, if switch 102 is open, switch 102 may be closed to connect the output of comparator 132 and therefore class D circuitry 144 to output stage 110. The class D pulses (pulses 100 of FIG. 4) that are produced are preferably strong enough to overdrive the signals produced by class AB circuitry 148, so amplifier 26 operates in class D mode. In this operating mode, amplifier 26 will consume a minimal amount of power, thereby extending battery life for device 10. In the event that amplifier 26 is already operating in class D mode when step 152 is reached, no changes need be made to the control signals on path 32.

If desired, the operating mode of amplifier 26 may be selected by adjusting the resistances produced by resistors 114 and 118 in real time (e.g., using variable resistors or other suitable adjustable-resistance components for resistors 114 and 118). This type of adjustment to the resistances of resistors 114 and 118 can be used to control the ratio of class AB operation to class D operation at the output stage. Arrangements in which amplifier 26 slowly varies the ratio of class AB behavior to class D behavior may be less noticeable to the user than more abrupt switching arrangements.

As indicated by line 154, once amplifier 26 has been adjusted in real time to place amplifier 26 in the low power mode of operation, processing may loop back to step 150.

If, during step 150, it is determined that there is a present need to operate wireless communications circuitry 16 or other suitable sensitive circuitry in device 10 (i.e., because this circuitry is currently in use or is about to be used by device 10), device 10 may adjust the state of the control signals on control path 32 of audio amplifier 26 accordingly (step 156). For example, if amplifier 26 is operating in a relatively noisy mode such as class D mode, the control signal on path 32 may be changed (e.g., from a logic low to a logic high or vice versa) to place amplifier 26 in a less noisy mode such as class AB mode. When the control signal changes in step 156, circuitry in audio amplifier 26 such as switch 102 of FIG. 5 may be adjusted to disable class D operation. For example, switch 102 may open, thereby disconnecting the output of class D amplifier circuitry 144 from output stage 110. When the overdrive signal from the output of comparator 146 is removed from output stage 110 in this way, amplifier 26 will revert to class AB operation. Because class AB circuitry 148 is always active, the transition from class D to class AB mode may be relatively smooth and glitch-free. If amplifier 26 is already operating in class AB mode, no changes need be made during step 156.

When operating in the low noise mode (e.g., class AB mode), amplifier 26 will consume a somewhat increased amount of power relative to the higher-noise low-power operating mode of step 152. Nevertheless, only low levels of noise will generally be produced, so that the potential for interference between the operation of audio amplifier 26 and wireless communications circuitry 16 (e.g., the radio-frequency receiver in circuitry 16) or other sensitive circuitry in device 10 is minimized or eliminated. Class D circuitry in amplifier 26 may be turned off when not in use and/or may be configured to minimize interference (e.g., by using an appropriate frequency for ramp generator 132, as described in connection with FIG. 5).

As indicated by line 158, after audio amplifier 26 has been placed in its low noise mode, processing can return to step 150.

The foregoing is merely illustrative of the principles of this invention and various modifications can be made by those skilled in the art without departing from the scope and spirit of the invention.

What is claimed is:

1. A method of operating an electronic device that contains an adjustable audio amplifier and at least one sensitive circuit that is sensitive to noise, comprising:

with circuitry in the electronic device, determining in real time whether there is a present need to operate the sensitive circuit;

if it is determined that there is a present need to operate the sensitive circuit, placing the adjustable audio amplifier in a first mode of operation; and if it is determined that there is no present need to operate the sensitive circuit, placing the adjustable audio amplifier in a second mode of operation, wherein the adjustable audio amplifier produces less noise in the first mode of operation than in the second mode of operation.

2. The method defined in claim 1 wherein the adjustable audio amplifier consumes more power in the first mode of operation than in the second mode of operation and wherein determining in real time whether there is a present need to operate the sensitive circuit comprises determining whether there is a present need to operate a wireless circuit in the electronic device.

3. The method defined in claim 1 wherein the adjustable audio amplifier consumes more power in the first mode of operation than in the second mode of operation and wherein determining in real time whether there is a present need to operate the sensitive circuit comprises determining whether there is a present need to operate a wireless radio-frequency receiver in the electronic device.

4. The method defined in claim 3 wherein placing the audio amplifier in the second mode of operation comprises placing the audio amplifier in a class D mode of operation.

5. The method defined in claim 3 wherein placing the audio amplifier in the first mode of operation comprises placing the audio amplifier in a class AB mode of operation and wherein placing the audio amplifier in the second mode of operation comprises placing the audio amplifier in a class D mode of operation.

6. The method defined in claim 1 wherein placing the audio amplifier in the first mode of operation comprises placing the audio amplifier in a class AB mode of operation and wherein placing the audio amplifier in the second mode of operation comprises placing the audio amplifier in a class D mode of operation.

7. The method defined in claim 1 wherein placing the audio amplifier in the first mode of operation comprises opening a switch to disconnect a class D circuit from an output stage in the audio amplifier.

8. The method defined in claim 1 wherein placing the audio amplifier in the second mode of operation comprises placing the audio amplifier in a class D mode of operation by closing a switch and connecting a comparator output to an output stage in the audio amplifier through the closed switch, wherein output signals from the comparator overdrive class AB signals from a class AB amplifier circuit when operating in the second mode of operation.

9. The method defined in claim 1 wherein placing the audio amplifier in the second mode of operation comprises placing the audio amplifier in a class D mode of operation and operating a class D amplifier ramp generator at a frequency that is an integer multiple of 217 Hz.

10. A handheld electronic device comprising:
an adjustable audio amplifier that operates in at least first and second modes of operation, wherein the adjustable audio amplifier consumes more power and produces less noise in the first mode of operation than in the second mode of operation;
at least one sensitive circuit that is sensitive to noise generated by the adjustable audio amplifier; and
circuitry that determines in real time whether or not there is a present need to operate the sensitive circuit and that places the adjustable audio amplifier in the first or second mode of operation based on whether or not there is a present need to operate the sensitive circuit.

11. The handheld electronic device defined in claim 10 wherein the sensitive circuit comprises wireless communications circuitry.

12. The handheld electronic device defined in claim 10 wherein the sensitive circuit comprises radio-frequency receiver circuitry that handles cellular telephone communications.

13. The handheld electronic device defined in claim 10 wherein the adjustable audio amplifier comprises a dual mode amplifier that operates as a class AB amplifier in the first mode of operation.

14. The handheld electronic device defined in claim 10 wherein the adjustable audio amplifier comprises a dual mode amplifier that operates as a class D amplifier in the second mode of operation.

15. The handheld electronic device defined in claim 14 wherein the adjustable audio amplifier comprises a dual mode amplifier that operates as a class AB amplifier in the first mode of operation.

16. The handheld electronic device defined in claim 14 further comprising wireless communications circuitry that includes the sensitive circuit, wherein the wireless communications circuitry produces a control signal that indicates whether or not the wireless communications circuit is receiving radio-frequency signals and wherein the adjustable audio amplifier comprises a switch that is controlled by the control signal.

17. The handheld electronic device defined in claim 14 wherein the audio amplifier circuitry comprises a dual mode amplifier that includes at least a class D amplifier circuit, the handheld electronic device further comprising wireless communications circuitry that includes the sensitive circuit, wherein the wireless communications circuitry produces a control signal that indicates whether or not the wireless communications circuit is receiving radio-frequency signals and wherein the adjustable audio amplifier comprises a switch that is controlled by the control signal to switch the class D amplifier circuit into use when the wireless communications circuit is not receiving the radio-frequency signals.

18. A cellular telephone comprising:
wireless communications circuitry that receives radio-frequency cellular telephone signals when in use; and
an adjustable dual mode audio amplifier that amplifies audio signals to be played through a speaker, wherein the adjustable dual mode audio amplifier and the wireless communications circuitry are configured so that the adjustable dual mode audio amplifier operates in a first mode when the wireless communications circuitry is in use to receive the radio-frequency cellular telephone signals and operates in a second mode when the wireless communications circuitry is not in use.

19. The cellular telephone defined in claim 18 wherein the adjustable dual mode audio amplifier comprises class AB amplifier circuitry and class D amplifier circuitry and wherein the adjustable dual mode audio amplifier and the wireless communications circuitry are configured so that the adjustable dual mode audio amplifier uses the class AB amplifier circuitry when operating in the first mode and uses the class D amplifier circuitry when operating in the second mode.

20. The cellular telephone defined in claim 19 wherein the adjustable dual mode audio amplifier comprises a ramp generator for the class D amplifier circuitry that operates at an integer multiple of 217 Hz.

21. The cellular telephone defined in claim 19 wherein the adjustable dual mode audio amplifier has an associated gain, wherein the adjustable dual mode audio amplifier comprises a feedback path that stabilizes the gain and comprises a low pass filter interposed in the feedback path.

* * * * *